(12) United States Patent
Sigmund

(10) Patent No.: US 8,331,851 B2
(45) Date of Patent: Dec. 11, 2012

(54) VERY SMALL APERTURE TERMINAL (VSAT) SITE DIAGNOSTICS

(75) Inventor: Jesse Paul Sigmund, Sachse, TX (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 982 days.

(21) Appl. No.: 12/180,698

(22) Filed: Jul. 28, 2008

(65) Prior Publication Data

US 2010/0022191 A1 Jan. 28, 2010

(51) Int. Cl.
  *H04H 20/74* (2008.01)
  *H04B 1/60* (2006.01)
  *H04B 7/216* (2006.01)
  *G01R 31/08* (2006.01)
  *G06F 11/00* (2006.01)
  *G08C 15/00* (2006.01)
  *H04J 1/16* (2006.01)
  *H04J 3/14* (2006.01)

(52) U.S. Cl. ........... 455/9; 455/3.02; 370/253; 370/216; 370/342; 370/230; 370/231; 375/222; 375/287

(58) Field of Classification Search ................. 455/3.02, 455/9; 370/253, 216, 342, 230, 231; 375/222, 375/287
See application file for complete search history.

(56) References Cited

U.S. PATENT DOCUMENTS

| | | | | |
|---|---|---|---|---|
| 6,266,545 | B1 * | 7/2001 | Backman et al. | 455/572 |
| 6,763,222 | B1 * | 7/2004 | Bukhari | 455/3.02 |
| 6,915,127 | B2 * | 7/2005 | Sakuma | 455/423 |
| 7,774,016 | B2 * | 8/2010 | Lloyd et al. | 455/522 |
| 8,031,634 | B1 * | 10/2011 | Artzi et al. | 370/254 |
| 2003/0224777 | A1 * | 12/2003 | Sakuma | 455/423 |
| 2004/0225927 | A1 * | 11/2004 | Warpenburg et al. | 714/47 |
| 2004/0229562 | A1 * | 11/2004 | Wren et al. | 455/3.02 |
| 2005/0215277 | A1 * | 9/2005 | Waye | 455/523 |
| 2006/0231502 | A1 * | 10/2006 | Ito et al. | 210/748 |
| 2007/0252571 | A1 * | 11/2007 | Hirata et al. | 323/304 |
| 2008/0064323 | A1 * | 3/2008 | Barda | 455/3.01 |
| 2008/0084714 | A1 * | 4/2008 | Kawasaki et al. | 363/21.01 |
| 2009/0135629 | A1 * | 5/2009 | Mancebo del Castillo Pagola | 363/34 |
| 2009/0209277 | A1 * | 8/2009 | Pinchas et al. | 455/501 |
| 2009/0284250 | A1 * | 11/2009 | Rittmann | 324/130 |
| 2010/0007334 | A1 * | 1/2010 | Apfel | 324/123 R |

* cited by examiner

*Primary Examiner* — Bobbak Safaipour

(57) ABSTRACT

An exemplary device samples a converter signal (e.g., input to a block up converter or output from a low noise block) at a very small aperture terminal site and identifies, as between a site converter and a site modem, a more likely faulty component to aid site diagnosis and repair.

21 Claims, 3 Drawing Sheets

VERY SMALL APERTURE TERMINAL (VSAT) SITE DIAGNOSTICS

BACKGROUND INFORMATION

When communications via a Very Small Aperture Terminal (VSAT) site fail or degrade, the site owner/operator typically dispatches a technician to diagnose and correct the problem. When initial diagnosis indicates that site components are likely faulty, the owner/operator sends replacement parts to the site. Because known diagnostic tools and techniques limit the dispatcher's ability to precisely isolate faulty components absent a trial-and-error swapping-out of suspect parts, the owner/operator sometimes sends a number of different replacement parts and instructs the dispatcher to return any parts that are ultimately deemed unnecessary for site repair. This back-and-forth treatment of spare components not only drives up shipping costs for the owner/operator, but also forces the owner/operator to expend resources in testing whether returned equipment is suitable for future use—even though such equipment may have been returned by a dispatcher without the dispatcher ever having removed it from its packaging.

DETAILED DESCRIPTION OF PREFERRED EMBODIMENTS

The following detailed description refers to the accompanying drawings. The same reference numbers in different drawings may identify the same or similar elements. The following detailed description does not limit the invention.

Figure 1:
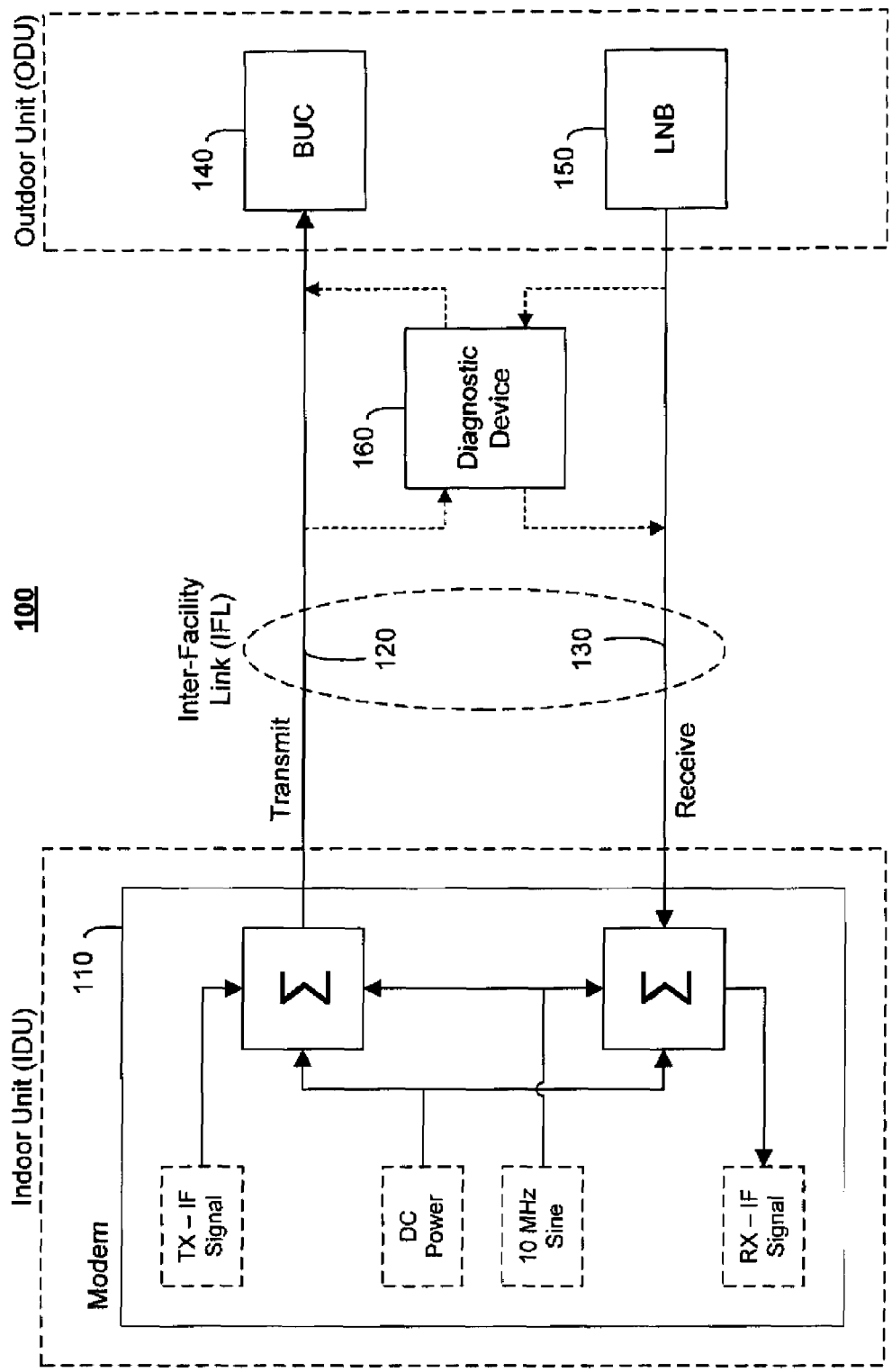
FIG. 1 depicts an exemplary system for diagnosing an under performing VSAT site in accordance with exemplary embodiments.

FIG. 1 depicts an exemplary VSAT site diagnostic system 100. As shown, exemplary system 100 includes a modem 110, a transmit link 120, a receive link 130, a transmit converter 140, a receive converter 150, and a diagnostic device 160. As indicated by dashed lines in the figure, modem 110 is typically housed within a VSAT site indoor unit (IDU), while converters 140, 150 are typically housed within a VSAT site outdoor unit (ODU). Also, links 120, 130 form an interfacility link (IFL) between modem 110 and converters 140, 150, as is well known.

Modem 110 can be any known VSAT modem suitable for facilitating bi-directional communication between an earth station and a satellite. In the ground-to-satellite or transmit direction, modem 110 combines an intermediate frequency transmit signal (designated TX-IF in FIG. 1) with direct current (DC) power and a reference signal (indicated, by way of example, as a 10 MHz sinusoid in FIG. 1) for conveyance via transmit link 120 to transmit converter 140.

Transmit link 120 can be any suitable wire-line or wireless link, and typically takes the form of one or more coaxial cables. Transmit converter 140 can be any suitable VSAT transmit converter, and is generally known as a block up-converter, or BUC, inasmuch as it typically translates a band (or "block") of frequencies from a lower portion of usable spectrum to a higher portion (e.g., from L band to Ku, C, or Ka band), as is well known.

The DC power conveyed via transmit link 120 energizes BUC 140, and BUC 140 utilizes the reference signal (e.g., as a phase locked loop reference) to up-convert and communicate the TX-IF signal to an earth satellite. More specifically, BUC 140 typically feeds an orthogonal mode transducer (OMT) which in turn drives a feed-horn for a reflector parabolic dish aimed at the satellite, as is well known.

In the satellite-to-ground or receive direction, receive converter 150 typically accepts a high-frequency satellite signal (e.g., via the above noted OMT) and down-converts it to provide an intermediate frequency receive signal (designated RX-IF in FIG. 1) for conveyance to modem 110 via receive link 130. Receive converter 150 can be any suitable VSAT receive converter, and is generally known as a low noise block, or LNB, inasmuch as it down-converts blocks of frequencies and operates in isolation from other noise-inducing electronics.

Like BUC 140, LNB 150 can receive DC power and a reference signal from modem 110, as is shown in FIG. 1. However, use of a reference signal by LNB 150 is relatively rare, occurring only in instances when highly stable and low phase noise LNB local oscillators are required in conjunction with advanced modulation/demodulation techniques, as is well known.

Should any of the above described VSAT transmission or reception functions fail or deteriorate, diagnostic device 160 facilitates troubleshooting as described hereinafter. Device 160 can be, for example, a portable (e.g., handheld) device or a stationary device situated at the VSAT site (e.g., positioned near or integrated with the ODU that houses converters 140, 150).

Figure 2:
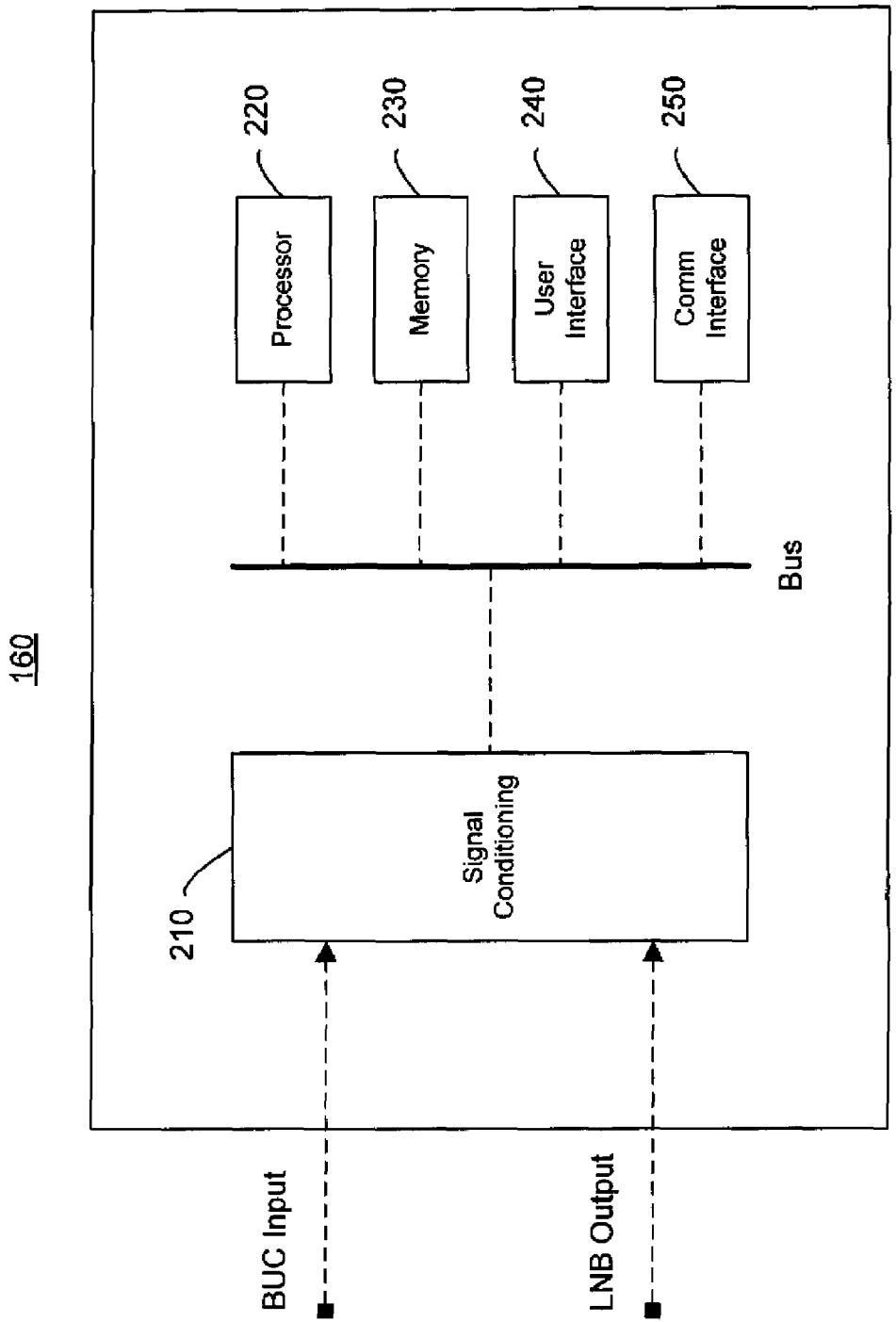
FIG. 2 depicts an exemplary diagnostic device for use in the system of FIG. 1.

FIG. 2 depicts an exemplary diagnostic device 160. As shown, exemplary device 160 includes signal conditioning circuitry 210, a processor 220, a memory 230, a user interface 240, and a communications interface 250. As indicated by dashed lines in the figure, the depicted device components can communicate, using well known techniques, via a common bus.

Signal conditioning circuitry 210 can be any known analog and/or digital circuitry suitable for sampling VSAT signals of interest (e.g., input/output at BUC 140 and/or LNB 150) and conveying the sampled signals for use by the various device components of FIG. 2. Toward this end, device 160 can be constructed such that inputs to conditioning circuitry 210 can be selectively coupled, physically or electronically, to transmit path 120 and/or receive path 130.

For example, device 160 can be constructed as a handheld device including appropriate (e.g., co-axial) connectors so that device 160 can be physically inserted in-line with BUC 140 and/or LNB 150. Alternately, device 160 can be fixed at the VSAT site, and inputs to conditioning circuitry 210 can be electronically or manually switched to make or break contact at the input and/or output of BUC 140 and/or LNB 150.

Processor 220 can include any known processor, microprocessor, or other processing logic suitable for interpreting and executing instructions. Also, memory 230 can include a random access memory (RAM) or any type of dynamic storage device that may store information and instructions for execution by processor 220. Memory 230 can also include a read-only memory (ROM) device, a disk drive, or any other type of static storage device suitable for storing data and/or instructions for use by processor 220.

User interface 240 can include any mechanism that permits a device operator to input information to device 160, such as a keyboard, a mouse, a pen, a microphone, voice recognition and/or biometric mechanisms, remote controls, etc. User interface 240 can also include any mechanism suitable for conveying information to the device operator, including a display such as a liquid crystal display (LCD) or light emitting diode (LED) display, a speaker, a printer, etc.

Communications interface 250 can include any known mechanism suitable for communicating information between device 160 and other external devices or systems. For example, interface 250 can include a serial port, a parallel port, and/or any modem or transceiver-like mechanism that enables device 160 to communicate with proximate and/or remote devices or systems (e.g., via any suitable wireline or wireless link or network).

As described herein, device 160 can perform certain operations in response to processor 220 executing software instructions contained in a computer-readable medium, such as memory 230. A computer-readable medium may be defined as a physical or logical memory device. The software instructions may be read into memory 230 from another computer-readable medium, such as a storage device, or from another device or system via communications interface 250.

Also, hardwired circuitry may be used in place of or in combination with software instructions to implement processes described herein. Consequently, processes described herein are not limited to any specific hardware and/or software combination.

Although FIG. 2 shows exemplary components of device 160, in other implementations device 160 may contain fewer, different, or additional components than depicted in FIG. 2. In still other implementations, one or more components of device 160 may perform one or more other tasks described as being performed by one or more other components of device 160.

To understand operation and use of device 160, it is instructive to consider the various types and causes of problems typically seen at a VSAT system such as system 100. For example, low transmit power (i.e., low transmit carrier-to-noise, or C/N, ratio) can be caused by poor weather conditions, an improper maximum power setting on modem 110, or failure of BUC 140. If site 100 does not transmit at all, it may mean that modem 110 is improperly configured for the particular type of BUC 140 being used, that transmit link 120 (e.g., an IFL cable) is disconnected or damaged, or that one or both of modem 110 and BUC 140 is defective.

Also, when site 100 exhibits low receive quality (i.e., low receive C/N ratio), it may be the result of poor weather conditions, or it may be that one or both of modem 110 and LNB 150 is faulty. If site 100 receives no signal at all, then the dish may not be properly aligned to the satellite, the receive link 130 (e.g., an IFL cable) may be disconnected or damaged, or one or both of modem 110 and LNB 150 may be defective.

Troubleshooting certain of the above described faults is straightforward. For example, one can readily check weather conditions, confirm modem configuration, and verify IFL cable integrity. However, when these checks have been made (and remedied as necessary) and the site still does not function correctly, then typically either modem 110 or one of converters 140, 150 (depending upon whether the problem relates to transmission or reception, respectively) is defective, and as noted above, it is difficult for a dispatcher in the field to determine precisely which component is bad short of a trial-and-error swapping-in of replacement components.

Advantageously, according to exemplary embodiments, empirical data can be utilized to facilitate identification of most likely faulty component(s) without swapping-in parts. For example, practice has shown that when a converter 140, 150 draws current, it will output at least a nominal signal. Though the output signal may be of insufficient power level or otherwise fail to meet manufacturer specifications, the output signal will nonetheless be present. Also, it has been observed that converters 140, 150 are rarely intermittently faulty—typically they either work continuously or don't work at all. By contrast, modem 110 is typically more complex in design, and may exhibit partial failure (e.g., everything works except the 10 MHz reference signal, etc.).

Device 160 can be programmed to take advantage of these and other observations to enable early or preliminary identification of most likely faulty component(s). For example, if system 100 fails or exhibits degradation in the transmit direction, device 160 can detect the direct current (DC) voltage level and DC current draw at or near the input of BUC 140, and determine whether the reference signal is present on the IFL cable at the input to BUC 140. If the detected voltage and current levels are within specification for BUC 140, it is highly probable that BUC 140 is operating as intended and that the transmit output of modem 110 is faulty. However, if the voltage level is within tolerance, but the current draw is incorrect (e.g., at or near zero, or otherwise out of spec), then BUC 140 is very likely defective. Also, if the reference signal is absent or incorrect, then modem 110 may be faulty irrespective of the voltage and current seen.

Accordingly, device 160 can apply logic to the values seen at BUC 140 to conclude, or enable a device user to conclude, that one or both of modem 110 and BUC 140 is likely faulty and should be replaced. Device 160 can make similar measurements, and apply analogous logic, at LNB 150 when system 100 fails or exhibits degradation in the receive direction. For example, device 160 can measure DC voltage and current at LNB 150, and (when appropriate) detect whether a reference signal is present at LNB 150. If the voltage and current are correct, then LNB 150 is likely working and the receive function of modem 110 is likely faulty. But if the voltage is correct and the current is incorrect, then LNB 150 is likely faulty. Also, if the reference is needed by LNB 150 but is absent or incorrect, then modem 110 may be faulty.

In view of the foregoing, exemplary troubleshooting logic is shown in table form below. The logic is applicable for both transmit and receive diagnostics in instances when the converter (i.e., BUC 140 when troubleshooting transmit problems, and LNB 150 when troubleshooting receive problems) requires a reference signal from modem 110. This logic is most often suitable for troubleshooting transmit problems, since as noted above BUC 140 typically requires a reference signal and LNB 150 typically does not.

| Exemplary Logic when Converter Requires Reference Signal | | | |
| --- | --- | --- | --- |
| Reference Present? | DC Voltage in Range? | DC Current in Range? | More Likely Faulty, Modem vs Converter |
| No | No | No | Modem |
| No | No | Yes | n/a |
| No | Yes | No | Inconclusive (Perhaps Both) |
| No | Yes | Yes | Modem |
| Yes | No | No | Modem |
| Yes | No | Yes | n/a |
| Yes | Yes | No | Converter |
| Yes | Yes | Yes | Inconclusive (Likely Neither) |

The first three columns in the table refer to observations made at a converter (i.e., at BUC 140 or at LNB 150 as appropriate), and the fourth column shows diagnostic inferences that can be made based on the observations as described above. Device 160 can be constructed and programmed to compute and display any or all of the results shown in the table. For example, device 160 can display only yes/no results of some or all observations made at the converter, thus leaving it to a device user to draw the diagnostic inferences. Alternatively or in addition, device 160 can compute and display the diagnostic inferences for the user. Moreover, device 160 can display actual signal values seen at the converter (e.g., DC voltage, DC current, transmit/receive signal strength, etc.) to aid the device user in making a diagnosis or otherwise.

In the table above, it is presumed that preliminary checks have been made and that weather, system power, modem configuration, IFL cable integrity, converter connections, etc. have checked out "OK." Accordingly, an indication in the table (or a display by device 160) of "Modem" can be interpreted, for example, as "Modem likely faulty—replace and retest prior to replacing converter or other components." Similarly, an indication/display of "Converter" can be interpreted as "Converter likely faulty—replace and retest prior to replacing modem etc."

However, if preliminary checks are not presumed, then an indication/display of "Modem" can be interpreted more broadly as, for example, "Likely modem error—check modem power, modem configuration, modem connections, etc. and retest prior to replacing components." Likewise, an indication/display of "Converter" can be interpreted as, for example, "Likely converter error—check IFL cable, converter connections, etc. and retest before replacing parts."

Note that an indication in the table of "n/a" (i.e., "not applicable") reflects a condition that generally should not occur (e.g., converter current in range when converter voltage is incorrect). Accordingly, if device 160 detects such a condition, it can display "Diagnostic Device Error" or the like. Also, note that an indication in the table of "Inconclusive" reflects a combination of observations that makes pinpointing a single most likely faulty device difficult. In such case, device 160 can display "Diagnosis Inconclusive" or the like, or it can display an inference relating to both modem and converter (e.g., "Both modem and converter may be faulty" when the reference signal is absent and the current is out of range, or "Neither the modem nor the converter is likely faulty" when the reference, voltage and current all appear correct).

When the converter under test (i.e., BUC 140 for transmit diagnostics, and LNB 150 for receive diagnostics) does not require a reference signal from modem 110, then the above described troubleshooting logic can be reduced to that shown in table form below. Such reduced logic is equivalent to applying the above described reference-required logic and always assuming that the reference signal is present. This reduced no-reference-required logic is most often suitable for troubleshooting receive problems, since LNB 150 typically does not use a reference.

| Logic when Converter Does Not Require Reference Signal | | |
|---|---|---|
| DC Voltage Present? | DC Current in Range? | Likely Faulty, Modem vs Converter |
| No | No | Modem |
| No | Yes | n/a |
| Yes | No | Converter |
| Yes | Yes | Inconclusive (Likely Neither) |

The precise logic implemented by device 160 can be preconfigured or read in from another device or system via communications interface 250. Similarly, specification data for modem 110, converters 140, 150, etc. can be preconfigured in device 160 or fed into device 160 via interface 250 (e.g., from another proximate device via a serial or parallel port, or from a remote device or system via a network). Moreover, various aspects of the functionality of device 160 can be made user-selectable via user interface 240 (e.g., enabling the user to select between transmit and receive modes, or to select a particular modem and/or converter from a menu, etc.)

Advantageously, device 160 can be constructed as a portable device for use by a dispatcher (e.g., as a handheld device, and possibly combined with well known satellite meter functionality such as that provided by the well known "Birdog" meters). Alternatively, device 160 can be fixed at site 100 and monitored/operated by a visiting dispatcher and/or by a remote operator (e.g., a technician situated at a central station to which device 160 is networked). In either case, useful functionality beyond that described above can be integrated into device 160.

For example, if device 160 is constructed to be inserted in-line with converters 140, 150, then the output of device 160 can be made switchable such that the device user can selectively create an electrical "open" at the device output. Doing so would, for example, allow the user to observe changes in the voltage and current values on the IFL as the circuit is terminated or un-terminated and thus enable the user to answer routine diagnostic questions (e.g., is the voltage at the converter low because the modem output voltage is not high enough, or because there is too much voltage drop across the IFL?). Advantageously, making the output of device 160 switchable enables the user to answer such questions without having to disconnect cables during system operation, which can lead to accidental shorts and equipment damage as is well known.

Figure 3:
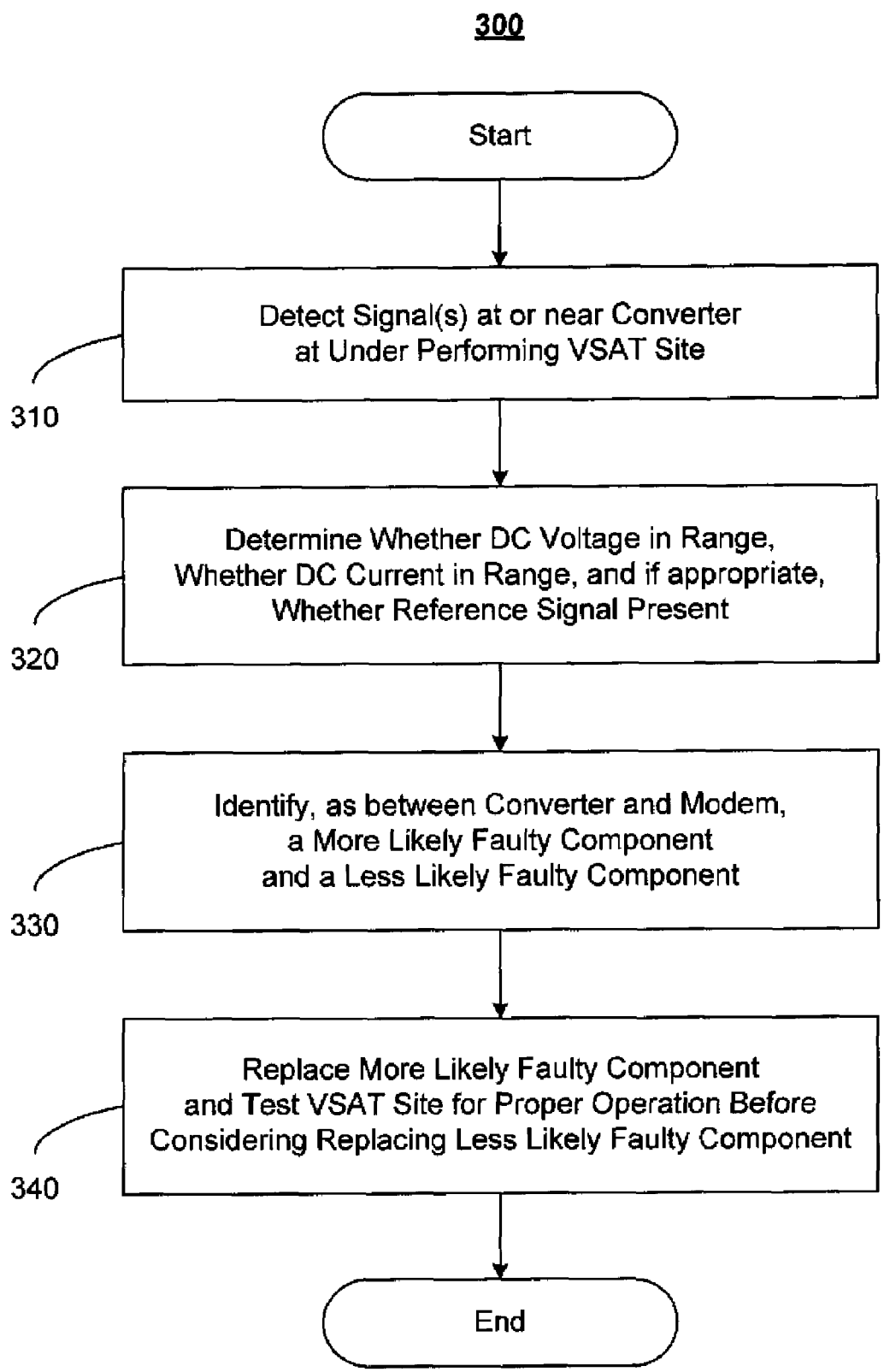
FIG. 3 depicts an exemplary process for diagnosing an under performing VSAT site in accordance with exemplary embodiments.

In view of the foregoing, FIG. 3 depicts an exemplary process 300 for diagnosing an under-performing VSAT site. Process 300 begins at block 310, in which one or more signals are detected at or near a converter of the underperforming site. Next, at block 320, a determination is made, based on the detected signal(s), as to whether a DC voltage at the converter is within an acceptable range, whether a DC current draw by the converter is within an acceptable range, and optionally, whether a reference signal is present and within specification at the converter.

These determinations are then used, at block 330, to identify, as between the converter and a modem of the underperforming site, a most likely faulty component and a least likely faulty component. Finally, at block 340, the most likely faulty component is replaced and the site is tested for proper operation before consideration is given as to whether to replace the least likely faulty component (i.e., replace the least likely faulty component only when replacing the most likely faulty component does not restore proper system operation).

The above described exemplary embodiments promote swift and accurate identification of faulty VSAT components, thereby reducing the time and cost associated with maintaining a VSAT site. For example, exemplary embodiments may significantly reduce unnecessary shipping of replacement components to support on-site diagnostics.

The foregoing description of implementations provides illustration and description, but is not intended to be exhaustive or to limit the invention to the precise form disclosed. Modifications and variations are possible in light of the above teachings or may be acquired from practice of the invention. For example, while a series of blocks are described with regard to certain of the figures, the order of the blocks may be modified in other implementations. Moreover, non-dependent blocks may be performed in parallel.

It will be apparent that embodiments, as described herein, may be implemented in many different forms of software, firmware, and hardware in the implementations illustrated in the figures. The actual software code or specialized control hardware used to implement embodiments described herein is not limiting of the invention. Thus, the operation and behavior of the embodiments were described without reference to the specific software code—it being understood that software and control hardware may be designed to implement the embodiments based on the description herein.

Further, certain portions of the invention may be implemented as "logic" that performs one or more functions. This logic may include hardware, such as an application specific integrated circuit or a field programmable gate array, or a combination of hardware and software.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The invention claimed is:

1. A method, comprising:
   detecting whether a direct current (DC) voltage is within a specified voltage range and whether a DC current is within a specified current range at a converter located at a very small aperture terminal (VSAT) site;
   concluding, based upon a result of said detecting, that one of the converter and a modem located at the site is a more likely faulty component and that another of the converter and the modem is a less likely faulty component;
   replacing the more likely faulty component; and
   testing for proper site operation before considering whether to replace the less likely faulty component.

2. The method of claim 1, wherein the converter is a block up converter (BUC).

3. The method of claim 1, wherein the converter is a low noise block (LNB) converter.

4. The method of claim 1, wherein the modem is deemed the most likely faulty component when the DC voltage is determined to be outside the specified voltage range and the DC current is determined to be outside the specified current range.

5. The method of claim 1, wherein the modem is deemed the most likely faulty component when the DC voltage is determined to be within the specified voltage range and the DC current is determined to be outside the specified current range.

6. The method of claim 1, wherein the modem is configured to provide a reference signal for use by the converter, and wherein the detecting includes detecting whether the reference signal is present at the converter.

7. The method of claim 6, wherein the modem is deemed the most likely faulty component when the reference signal is absent at the converter.

8. The method of claim 1, wherein at least one of the specified voltage range and the specified current range is set based on a type of the converter.

9. A device, comprising:
   an input configured to receive one or more sample signals representative of one or more converter signals present at a converter of a very small aperture terminal (VSAT) site; and
   a processor configured to determine, based on the one or more sample signals, whether a direct current (DC) voltage at the converter is within a specified voltage range and whether a DC current at the converter is within a specified current range, wherein the processor is configured to further determine that one of the converter and a modem of the VSAT site is a more likely faulty component.

10. The device of claim 9, further comprising:
    a display configured to indicate to a user of the device whether the DC voltage is within the specified voltage range and whether the DC current is within the specified current range.

11. The device of claim 9, wherein the processor is configured to conclude the modem is the more likely faulty component when the DC voltage is determined to be outside the specified voltage range and the DC current is determined to be outside the specified current range.

12. The device of claim 9, wherein the processor is configured to conclude the converter is the more likely faulty component when the DC voltage is determined to be within the specified voltage range and the DC current is determined to be outside the specified current range.

13. The device of claim 9, further comprising:
    a display configured to indicate to a user of the device the more likely faulty component.

14. The device of claim 9, wherein the converter is a block up converter (BUC).

15. The device of claim 9, wherein the converter is a low noise block (LNB) converter.

16. The device of claim 9, further comprising:
    a modem configured to communicate with a VSAT central station.

17. The device of claim 9, further comprising:
    a memory configured to store component specification information, including converter specification information.

18. The device of claim 17, wherein the processor is configured to retrieve the component specification information from a source external to the device.

19. The device of claim 9, further comprising:
    a switch enabling a device user to selectively decouple the converter from a modem of the VSAT site and view a signal effect of the decoupling.

20. The device of claim 9, further comprising:
    a display configured to show a user of the device at least one of the DC current at the converter and the DC voltage at the converter.

21. The device of claim 20, wherein the display also shows at least one of a characteristic of a reference signal present at the converter and an indication of a signal strength at the converter.

* * * * *